(12) United States Patent
Wakimoto et al.

(10) Patent No.: US 11,163,014 B2
(45) Date of Patent: Nov. 2, 2021

(54) ELECTRICAL LEAKAGE DETERMINATION SYSTEM

(71) Applicant: DENSO CORPORATION, Kariya (JP)

(72) Inventors: Toru Wakimoto, Nisshin (JP); Yusuke Shindo, Kariya (JP); Masakazu Kouda, Kariya (JP)

(73) Assignee: DENSO CORPORATION, Kariya (JP)

( * ) Notice: Subject to any disclaimer, the term of this patent is extended or adjusted under 35 U.S.C. 154(b) by 71 days.

(21) Appl. No.: 16/591,764

(22) Filed: Oct. 3, 2019

(65) Prior Publication Data
US 2020/0110122 A1 Apr. 9, 2020

(30) Foreign Application Priority Data

Oct. 3, 2018 (JP) .............................. JP2018-188668

(51) Int. Cl.
*G01R 31/50* (2020.01)
*G01R 31/40* (2020.01)

(52) U.S. Cl.
CPC ............. *G01R 31/50* (2020.01); *G01R 31/40* (2013.01)

(58) Field of Classification Search
CPC ........ G01R 31/40–42; G01R 31/50–52; G01R 31/54; G01R 31/55; G01R 31/56
See application file for complete search history.

(56) References Cited

U.S. PATENT DOCUMENTS

| | | |
|---|---|---|
| 5,818,236 A | 10/1998 | Sone et al. |
| 6,362,627 B1 * | 3/2002 | Shimamoto ............ G01R 19/25 324/434 |
| 2004/0227521 A1 * | 11/2004 | Higashihama ......... G01R 31/50 324/522 |
| 2004/0243288 A1 * | 12/2004 | Kito ....................... G01R 31/50 702/183 |
| 2005/0146335 A1 * | 7/2005 | Wild ....................... G01R 31/52 324/510 |
| 2005/0189949 A1 * | 9/2005 | Shimizu ............. G01R 31/3835 324/434 |
| 2010/0156426 A1 * | 6/2010 | Kang .................... B60L 3/0069 324/444 |

(Continued)

FOREIGN PATENT DOCUMENTS

| | | |
|---|---|---|
| JP | 2016-099323 A | 5/2016 |
| JP | 2017-133965 A | 8/2017 |

*Primary Examiner* — Patrick Assouad
*Assistant Examiner* — Demetrius R Pretlow
(74) *Attorney, Agent, or Firm* — Oliff PLC

(57) ABSTRACT

An electrical leakage determination system that determines if an electrical leakage occurs includes a capacitor having first and second ends connected to a cathode side power supply path and a grounding section and a switch disposed in an electrical path formed parallel to the capacitor. When the capacitor discharges and a predetermined period has elapsed after the controller sets an energized state between the cathode-side power supply path and the grounding section by bringing the switch to an energizing position, the controller allows the capacitor to charge by setting an energization shut down state between the cathode-side power supply path and the grounding section by bringing the switch to an energization shut down position. The controller subsequently detects a voltage value of the capacitor and determines if the electrical leakage is either present or absent based on the voltage value.

4 Claims, 9 Drawing Sheets

(56) References Cited

U.S. PATENT DOCUMENTS

| | | | | |
|---|---|---|---|---|
| 2010/0237872 A1* | 9/2010 | Kang | .................... | H01M 10/42 324/429 |
| 2011/0084705 A1* | 4/2011 | Kawamura | .......... | G01R 27/025 324/551 |
| 2012/0206152 A1* | 8/2012 | Naruse | .................... | G01R 31/52 324/557 |
| 2012/0206153 A1* | 8/2012 | Naruse | .................... | G01R 31/50 324/557 |
| 2012/0249074 A1* | 10/2012 | Tsuchiya | ............ | G01R 31/3835 320/116 |
| 2012/0299599 A1* | 11/2012 | Naruse | .................... | H02H 3/044 324/509 |
| 2013/0063152 A1* | 3/2013 | Kasashima | ............ | G01R 31/52 324/509 |
| 2014/0021961 A1* | 1/2014 | Yamada | ................. | G01R 31/52 324/503 |
| 2014/0197841 A1* | 7/2014 | Mizoguchi | ............ | B60L 3/0046 324/434 |
| 2015/0194922 A1* | 7/2015 | Sato | ........................ | G01R 31/14 318/504 |
| 2015/0285851 A1* | 10/2015 | Kawamura | ........... | B60L 3/0069 324/509 |
| 2016/0091552 A1* | 3/2016 | Yasukawa | ........... | G01R 31/007 324/503 |
| 2017/0012422 A1* | 1/2017 | Mizoguchi | ............ | H02H 11/005 |
| 2017/0016959 A1* | 1/2017 | Mizoguchi | ................ | H02H 3/17 |
| 2017/0097384 A1* | 4/2017 | Yamada | ................. | H02J 7/0047 |
| 2017/0108556 A1 | 4/2017 | Yamamoto et al. | | |
| 2017/0131339 A1* | 5/2017 | Inamoto | .............. | G01R 31/40 |
| 2017/0299658 A1* | 10/2017 | Kozuka | ................ | H02J 7/0021 |
| 2018/0348284 A1* | 12/2018 | Tateda | .................... | G01R 31/64 |
| 2018/0351494 A1* | 12/2018 | Tateda | .................... | G01R 31/40 |
| 2018/0375387 A1* | 12/2018 | Oshima | ................. | G01R 31/52 |
| 2019/0064245 A1* | 2/2019 | Chiang | ................. | G01R 31/50 |
| 2019/0219621 A1* | 7/2019 | Morimoto | ................. | B60L 58/24 |

* cited by examiner

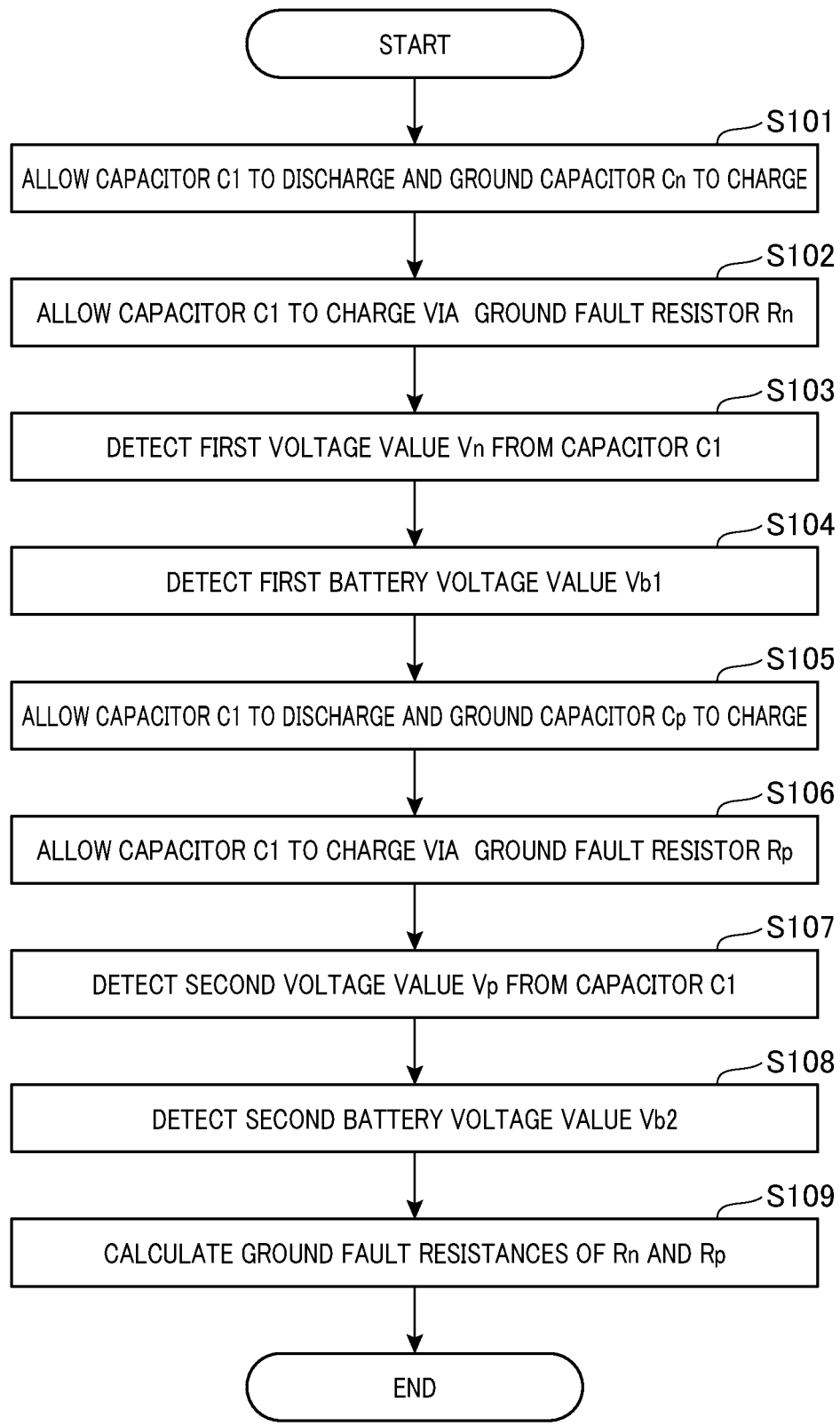

ELECTRICAL LEAKAGE DETERMINATION SYSTEM

CROSS-REFERENCE TO RELATED APPLICATION

This patent application is based on and claims priority to Japanese Patent Application No. 2018-188668, filed on Oct. 3, 2018 in the Japan Patent Office, the entire disclosure of which is hereby incorporated by reference herein.

BACKGROUND

Technical Field

Embodiments of this disclosure relate to an electrical leakage determination system to determine if an electrical leakage has occurred in a circuit including a voltage generator.

Related Art

A known electrical leakage determination system (i.e., an insulation state detecting system) utilizes a flying capacitor (i.e., a detection capacitor) to determine if an electrical leakage (i.e., not an insulating state) has occurred in an electrical system mounted on a vehicle based on a decrease in ground fault resistance. Such an electrical leakage determination system charges the flying capacitor disposed between a power supply line of the voltage generator and a ground line (e.g., a car body) and calculates a ground fault resistance (i.e., an insulation resistance between the power supply line and the ground line) based on a voltage generated in the flying capacitor. The electrical leakage determination system then determines whether an insulation state is maintained (i.e., whether an electrical leakage occurs).

In general, in such an electrical leakage determination system, a stray capacitance and a noise removal capacitor exist between the power supply line and the ground line, and can greatly affect the electrical leakage determination system sometimes. That is, since the ground capacitance also charges at the same time, the voltage of the flying capacitor is erroneously detected.

More specifically, when the ground capacitance charges together with the flying capacitor, an amount of change in charged voltage (i.e., a change in CR time constant) of the flying capacitor varies depending on a value of the ground capacitance. Specifically, when the ground capacitance is relatively large, the amount of change in charged voltage of the flying capacitor increases and a detection error becomes greater at a beginning of charging than when the ground capacitance is relatively small.

In view of this, by taking a time of charging the ground capacitance into account, the known electrical leakage determination system delays a time of detecting the charged voltage of the flying capacitor. Specifically, the charged voltage of the flying capacitor is detected multiple times when a given period has elapsed after the start of charging, and the ground fault resistance is calculated based on a rate of change in voltage value (i.e., an inclination of voltage values). Hence, accuracy of detection of the ground fault resistance is thereby increased even in a situation in which the ground capacitance exists between the power supply line and the grounding line and greatly affects the detection of the charged voltage.

However, even though the known electrical leakage determination system can reduce the detection error caused by the ground capacitance, the rate of change in voltage value is not equal even if the given period has elapsed after the start of charging in the situation in which the ground capacitance exists as different from a situation in which the ground capacitance is absent. That is, the detection error yet remains in the known electrical leakage determination system. Further, the larger the ground capacitance, the greater the detection error.

SUMMARY

Accordingly, the present invention has been made in view of the above-described problem, in particular as discussed in Japanese Unexamined Patent Application Laid Open No. 2016-99323, and an object thereof is to provide a novel electrical leakage determination system capable of improving detection accuracy. That is, one aspect of the present disclosure provides a novel electrical leakage determination system to determine if an electrical leakage occurs between a power supply path connected to a power supply terminal of a DC power supply and a grounding section. The electrical leakage determination system includes a capacitor having first and second ends respectively connected to the power supply path and the grounding section; at least one first switch disposed in an electrical path formed parallel to the capacitor to switch a state between the power supply path and the grounding section between an energized state and an energization shut down state; and a capacitor voltage detector to detect a voltage value of the capacitor. The electrical leakage determination system also includes a controller to control the at least one first switch. The controller sets the energized state between the power supply path and the grounding section by bringing the at least one first switch to the energizing position. The controller brings the at least one first switch to the energization shut down position and allows the capacitor to charge when a given period has elapsed after setting the energized state between the power supply path and the grounding section. The controller subsequently detects a voltage value of the capacitor and determines if the electrical leakage occurs based on the voltage value.

According to the above-described configuration, an energization shut down state is set between the power supply path and the grounding section by turning the first switch and the capacitor is controlled to charge when a given period of time has elapsed after the capacitor discharges and an energizing state is set between the power supply path and the grounding section by oppositely turning the first switch. That is, the ground capacitance such as a stray capacitance, etc., existing between the power supply path and the grounding section charges before the capacitor starts charging. Hence, when the capacitor charges, power supply to the ground capacitance can be either suppressed or reduced. Therefore, detection error can be reduced even if the ground capacitance varies. In addition, a period from the start of charging to a time of detecting the electrical leakage can be shortened.

Another aspect of the present disclosure provides a novel electrical leakage determination system connected to both of a cathode side power supply path connected to a positive side terminal of a DC power supply and an anode-side power supply path connected to an anode side terminal of the DC power supply. The leak determination system determines if an electrical leakage occurs between the cathode-side power supply path and the grounding section, and an electrical leakage between the anode side power supply path and the grounding section. The electrical leakage determination system further includes a capacitor having first and second ends respectively connected to the cathode-side power supply path and the anode side power supply path; and a cathode-side switch to switch a state between the cathode-side power supply path and the capacitor between an energized state and an energization shut down state. The cathode-side switch includes first and second ends respectively connected to a cathode-side power supply path and the first end of the capacitor. The electrical leakage determination system further includes an anode-side switch to switch a state between the anode-side power supply path and the capacitor between an energized state and an energization shut down state. The anode-side switch includes first and second ends respectively connected to the anode-side power supply path, and the second end of the capacitor. The electrical leakage determination system further includes a first grounding section side switch to switch a state between the grounding section and the capacitor between an energized state and an energization shut down state. The first grounding section side switch includes first and second ends respectively connected to the grounding section and the first end of the capacitor. The electrical leakage determination system further includes a second grounding section side switch to switch a state between the grounding section and the capacitor between an energized state and an energization shut down state. The second grounding section side switch includes first and second ends respectively connected to the grounding section and the second end of the capacitor. The electrical leakage determination system further includes a capacitor voltage detector to detect a voltage value of the capacitor; and a controller to control each of the first to fourth switches. When the cathode-side switch is brought to the energizing position, the anode-side switch is brought to the energization shut down position, the capacitor discharges, and when a predetermined time has elapsed after the controller sets the energized state between the cathode-side power supply path and the grounding section by bringing the first grounding section side switch to the energizing position, the controller allows the capacitor to charge by bringing the second grounding section side switch to the energizing position while bringing the first grounding section side switch to the energization shut down position. The controller subsequently detects a voltage value of the capacitor as a first voltage value. Further, when the cathode-side switch is brought to the energization shut down position, the anode-side switch is brought to the energizing position, the capacitor discharges, and when a predetermined period has elapsed after the controller sets the energized state between the anode-side power supply path and the grounding section by bringing the second grounding section side switch to the energizing position, the controller allows the capacitor to charge by bringing the first grounding section side switch to the energizing position while bringing the second grounding section side switch to the energization shut down position. The controller subsequently detects a voltage value of the capacitor as a second voltage value and determines if the electrical leakage occurs based on the first and second voltage values.

According to the above-described configuration, an energization shut down state is set between the power supply path and the grounding section and the capacitor charges when a given period of time has elapsed after the capacitor discharges and an energizing state is set between the power supply path and the grounding section. That is, the ground capacitance such as a stray capacitance, etc., existing between the supply path and the grounding section charges before the capacitor starts charging. Hence, when the capacitor charges, power supply to the ground capacitance can be either suppressed or reduced. Therefore, the detection error can be reduced even if the ground capacitance varies. In addition, a period from the start of charging to a time of detecting the electrical leakage can be shortened.

Further, with the above-described configuration of the embodiments of the present disclosure, a single capacitor can be shared to determine both of insulation statuses between the cathode side power supply path and the grounding section and the anode-side power supply path and the grounding section, respectively. Hence, an electric circuit can be simplified by decreasing the number of circuit elements.

BRIEF DESCRIPTION OF THE DRAWINGS

A more complete appreciation of the present disclosure and many of the attendant advantages of the present disclosure will be more readily obtained as substantially the same becomes better understood by reference to the following detailed description when considered in connection with the accompanying drawings, wherein:

FIG. 2 is a flowchart illustrating an exemplary ground fault resistance calculation process according to the first embodiment of the present disclosure;

DETAILED DESCRIPTION

Figure 1:
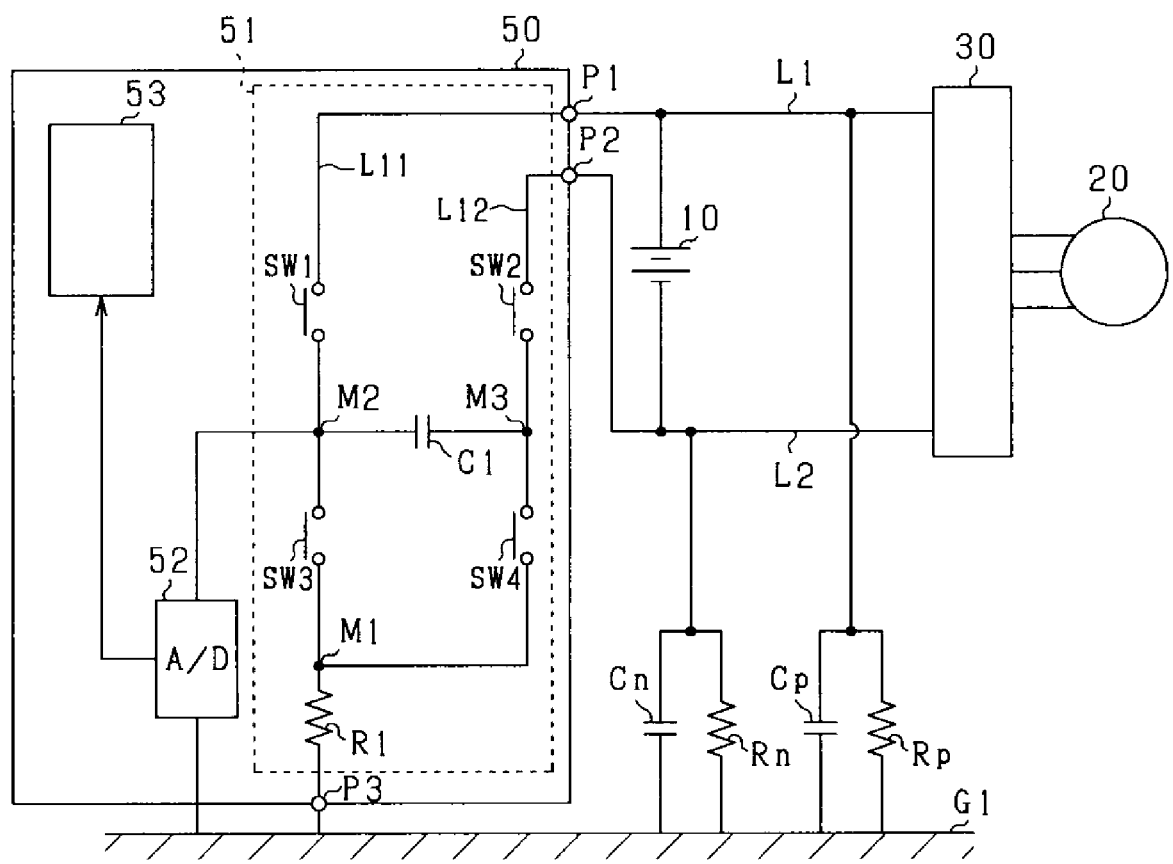
FIG. 1 is a diagram illustrating an exemplary electric circuit of an electrical leakage determination system according to a first embodiment of the present disclosure.

Referring now to the drawings, wherein like reference numerals designate identical or corresponding parts throughout the several views thereof, and to FIG. 1 and applicable drawings, an exemplary electrical leakage determination system of a first embodiment of the present disclosure, which is applied to a vehicle, such as a hybrid car, an electric motor, etc., having a rotary electric motor as a primary in-vehicle machine is described.

As shown in FIG. 1, an in-vehicle motor control system of this embodiment of the present disclosure includes an assembled battery 10, a motor 20, an inverter 30, and an electrical leakage determination system 50.

The assembled battery 10 is electronically connected to the motor 20 via the inverter 30. The assembled battery 10 is, for example, a secondary battery having more than 100V across multiple terminals and is configured by connecting multiple battery modules with each other in series. Each of the battery modules is configured by connecting multiple battery cells with each other in series as well. As the battery cell, a lithium-ion secondary battery and a nickel hydride secondary battery can be used, for example. The assembled battery 10 corresponds to a DC (direct current) power supply.

The motor 20 is a rotary electric motor acting as a primary in-vehicle machine and is enabled to transmit power to drive wheels (not illustrated). In this embodiment of the present disclosure, a three-phase permanent magnet synchronous motor is used as the motor 20.

The inverter 30 is composed of a full-bridge circuit having the same numbers of upper and lower arms as the numbers of phases of windings. An energization current is adjusted in each of the windings by turning on/off switches (e.g., semiconductor switching elements) provided in each of the arms.

Further, an inverter control system (not shown) is provided in the inverter 30. The inverter control system performs energization control by turning on/off switches in the inverter 30 based on various detection information and requests for power running drive and power generation generated in the motor 20. With this, the inverter control system supplies power from the assembled battery 10 to the motor 20 via the inverter 30 to let the motor 20 perform the power running drive. Further, the inverter control system also lets the motor 20 perform the power generation based on motive power transmitted from the drive wheels, converts generated electric power, and supplies a conversion result to the assembled battery 10 via the inverter 30, thereby charging the assembled battery 10.

A cathode side terminal of an electrical load such as the inverter 30, etc., is connected to a cathode-side power supply path L1 connected to a cathode side power supply terminal of the assembled battery 10. The cathode-side power supply path L1 is electrically insulated from a grounding section G1 of the car body or the like. Such an insulation state (a ground insulation resistance) between the cathode side power supply path L1 and the grounding section G1 can be represented by a ground fault resistance Rp. Further. between the cathode side power supply path L1 and the grounding section G1, a capacitor for noise removal and a stray capacitance exist and are collectively represented by a ground capacitance Cp.

An anode side terminal of an electrical load such as the inverter 30, etc., is connected to an anode-side power supply path L2 connected to an anode side power supply terminal of the assembled battery 10. The anode-side power supply path L2 is also electrically insulated from the grounding section G1. Such an insulation state (i.e., a ground insulation resistance) between the anode side power supply path L2 and the grounding section G1 can be represented by a ground fault resistance Rn. Further. between the anode side power supply path L2 and the grounding section G1, a ground capacitance, such as a capacitor for noise removal, a stray capacitance, etc., exists, and is collectively represented by a ground capacitance Cn.

To the electrical leakage determination system 50, the cathode side power supply path L1 and the anode side power supply path L2 are connected. The electrical leakage determination system 50 detects the ground fault resistances Rp and Rn and determines whether the cathode side power supply path L1 and the anode side power supply path L2 are normally insulated from the grounding section G1, i.e., whether an electrical leakage is either present or absent. Herein below, the electrical leakage determination system 50 is described in more detail.

As shown in FIG. 1, the electrical leakage determination system 50 includes an insulation resistance detection circuit 51 of a so-called flying capacitor type, an A/D (analog to digital) convertor 52 as a capacitor voltage detector, and a controller 53.

The insulation resistance detection circuit 51 includes an external terminal P1 connected to the cathode side power supply path L1, an external terminal P2 connected to the anode-side power supply path L2, and an external terminal P3 connected to the grounding section G1.

Between the external terminals P1 and P3, specifically, the cathode side power supply path L1 and the grounding section G1, a first electrical path L11 is provided. In the first electrical path L11, two switches SW1 and SW3 and a resistor R1 are disposed. One end of the switch SW1 is connected to the cathode side power supply path L1 through the external terminal P1. The other end of the switch SW1 is connected to one end of the switch SW3 in series. The other end of the switch SW3 is connected to one end of the resistor R1 in series as well. The other end of the resistor R1 is connected to the grounding section G1 through the external terminal P3.

A second electrical path L12 is also provided between a connection point M1, positioned between the switch SW3 and the resistor R1, and the external terminal P2. Specifically, between the connection point M1 and the anode-side power supply path L2, the second electric path L12 is provided. In the second electrical path L12, two switches SW2 and SW4 are provided. One end of the switch SW2 is connected to the anode side power supply path L2 through the external terminal P2. The other end of the switch SW2 is connected to one end of the switch SW4 in series. The other end of the switch SW4 is connected to one end of the resistor R1 in series via the connection point M1.

Further, the insulation resistance detection circuit 51 includes a capacitor C1 of a so-called flying capacitor. One end of the capacitor C1 is connected to the connection point M2 located between the switches SW1 and SW3. The other end of the capacitor C1 is connected to a connection point M3 located between the switches SW2 and SW4.

Therefore, an electrical path formed by including the connection point M2, the capacitor C1, the connection point M3, the switch SW4, and the connection point M1 is parallel with an electrical path formed by including the connection point M2, the switch SW3, and the connection point M1. Specifically, the switch SW3 is provided in the electrical path (M2, SW3 and MI) parallel to the capacitor C1.

Further, an electrical path formed by including the connection point M3, the capacitor C1, the connection point M2, the switch SW3, and the connection point M1 is parallel with an electrical path formed by including the connection point M3, the switch SW4 and the connection point M1. Specifically, the switch SW4 is provided in the electrical path (M3, SW4 and MI) parallel to the capacitor C1.

Hence, the switch SW1 corresponds to a cathode side switch, and the switch SW2 corresponds to an anode side switch. Also, the switch SW3 corresponds to a first grounding section side switch, and the switch SW4 corresponds to a second grounding section side switch as well.

One end of the A/D convertor 52 is connected to the connection point M2, and the other end thereof is connected to the grounding section G1. The A/D convertor 52 converts signals (i.e., analog signals) input via the connection point M2 into signals (i.e., digital signals) suitable for processing in the controller 53, thereby outputting the conversion result.

The controller 53 is configured mainly by a microcomputer including a CPU (central processing unit), a ROM (read only memory) and a RAM (random access memory) and I/O (input/output) port or the like. The controller 53 provides various functions when the CPU runs programs stored in the ROM. Here, the various functions can be provided by either electronic circuits as a hardware or at least partially software (i.e., processing of a computer). The controller 53 may function to determine if an electrical leakage is either present or absent by selectively turning on and off the various switches SW1 to SW4 as described herein below.

FIG. 2 is a flowchart illustrating an exemplary ground fault resistance calculation process periodically performed by the controller 53. Initially, as shown in the drawing, the controller 53 lets the capacitor C1 discharge, and the ground capacitance Cn charge for a given period. (in step S101).

Figure 3A:
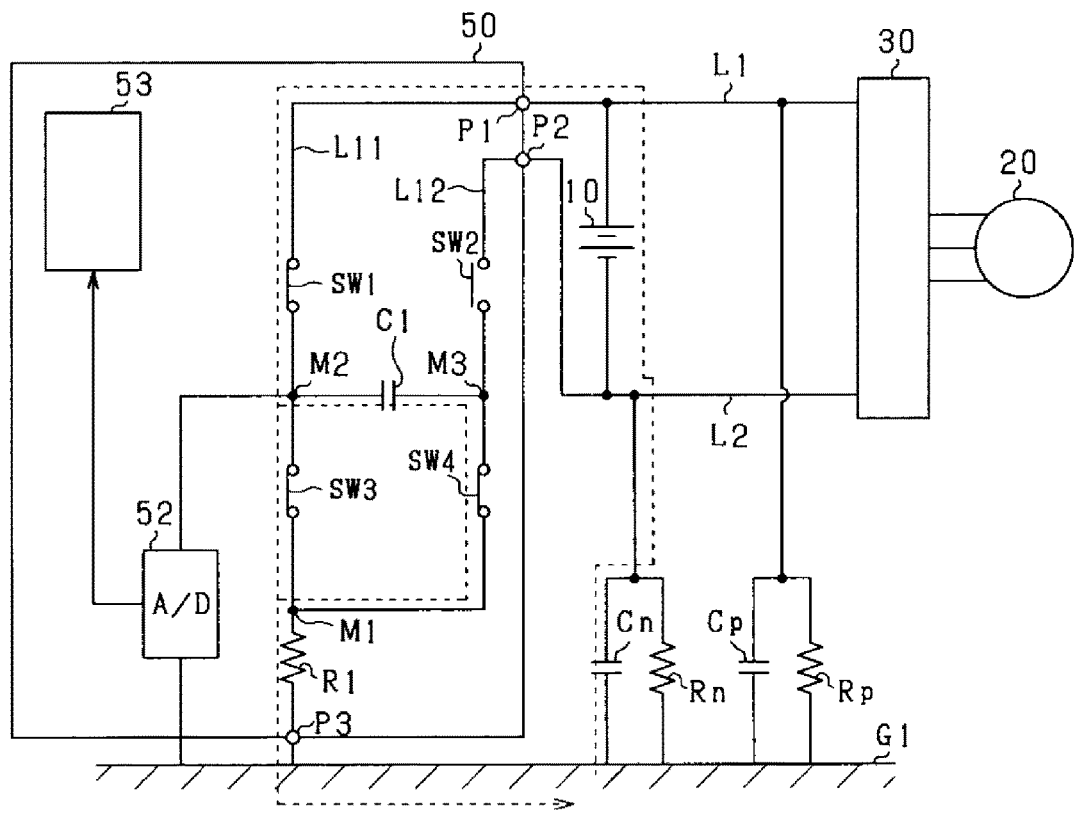
FIGS. 3A and 3B are diagrams collectively illustrating an exemplary flow of electric current according to one embodiment of the present disclosure.

Specifically, as shown in FIG. 3A, the switches SW1, SW3, and SW4 are turned on, while the switch SW2 is turned off. With this, current flows from the assembled battery 10 into an electrical path formed by including the assembled battery 10, the switch SW1, the switch SW3, the resistor R1, the grounding section G1, the ground capacitance Cn, and the assembled battery 10, thereby causing the ground capacitance Cn to charge. At the same time, current flows from the capacitor C1 into an electrical path formed by including the capacitor C1, the switch SW3, the switch SW4, and the capacitor C1, thereby causing the capacitor C1 to discharge.

Figure 3B:
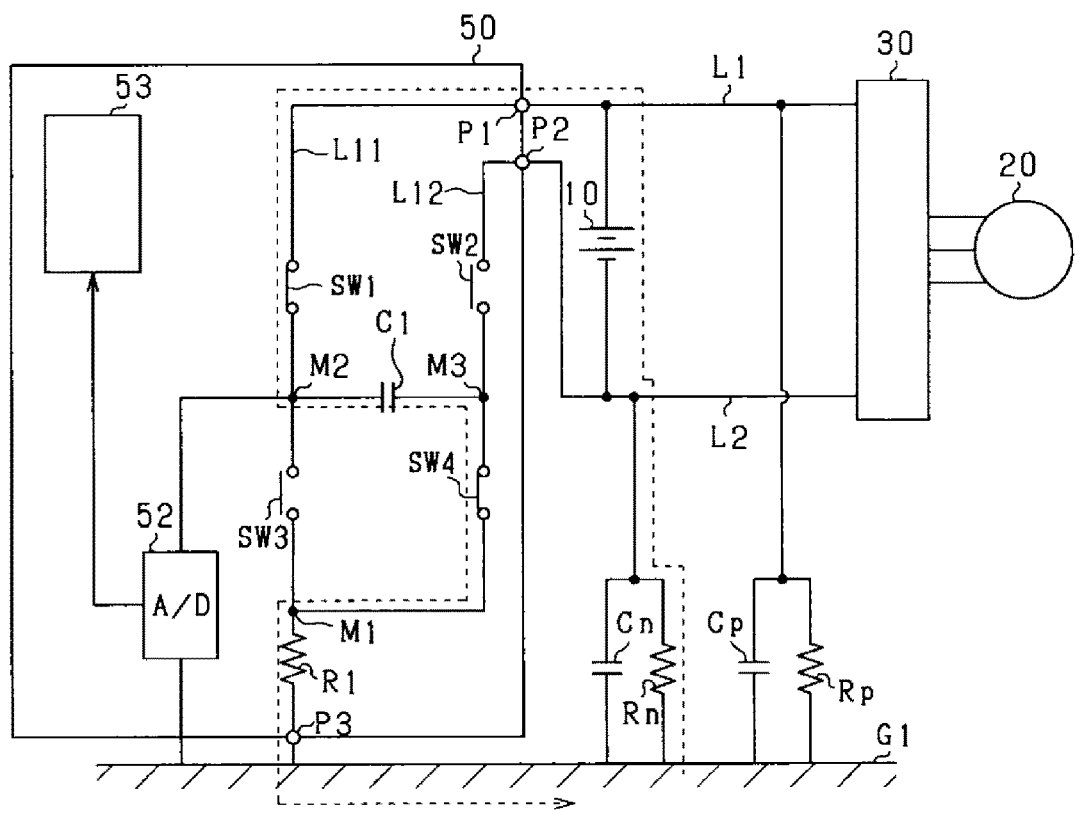

Subsequently, the controller 53 allows the capacitor C1 to charge via the ground fault resistance Rn for a prescribed period (in step S102). Specifically, as shown in FIG. 3B, the switches SW1 and SW4 are turned on, and, on the other hand, the switches SW2 and SW3 are turned off. With this, current flows from the assembled battery 10 into an electrical path formed by including the assembled battery 10, the switch SW1, the capacitor C1, the switch SW4, the resistor R1, the grounding section G1, the ground fault resistance Rn, and the assembled battery 10, thereby causing the capacitor C1 to charge. Here, since the ground capacitance Cn has charged in step S101, the current is almost flown through the ground fault resistance Rn. Hence, in steps S101 and S102, the switch SW3 corresponds to a first switch, and the switch SW4 corresponds to a second switch.

Subsequently, the controller 53 reads (i.e., detects) a first voltage value Vn (a charged voltage value) of the capacitor C1 (in step S103). Specifically, the controller 53 turns on the switch SW4, and turns off the switches SW1 to SW3, on the other hand, thereby inputting the voltage value of the capacitor C1 to the A/D convertor 52. Subsequently, the controller 53 reads a voltage value of the capacitor C1 converted by the A/D convertor 52 via the A/D convertor 52 as a first voltage value Vn. More specifically, the controller 53 detects a peak voltage value output from the capacitor C1 as the first voltage value Vn immediately after turning the switches SW1 to SW4. Therefore, the A/D convertor 52 corresponds to a capacitor voltage detector.

Subsequently, the controller 53 reads a battery voltage value Vb of the assembled battery 10 (in step S104). Here, a method of detecting the battery voltage value Vb is optionally employed. Further, to let the capacitor C1 charge, the controller 53 turns on the switches SW1 and SW2 while turning off the switches SW3 and SW4, for example. Subsequently, the controller 53 turns on the switch SW4 while turning off the switches SW1 and SW3 to let the capacitor C1 discharge. The controller 53 then inputs a voltage value of the capacitor C1 to the A/D convertor 52. The controller 53 preferably detects such a voltage value as the battery voltage value Vb. Hence, the A/D convertor 52 corresponds to a power supply voltage detector 11. Further, the controller 53 desirably detects a peak voltage value output from the capacitor C1 immediately after turning the switches SW1 to SW4 as the battery voltage value Vb. Otherwise, by providing a power supply voltage detector in the assembled battery 10, a detection result can be obtained from the power supply voltage detector. Hence, the battery voltage value Vb detected in step S104 is represented by a first battery voltage value Vb.

Figure 4A:
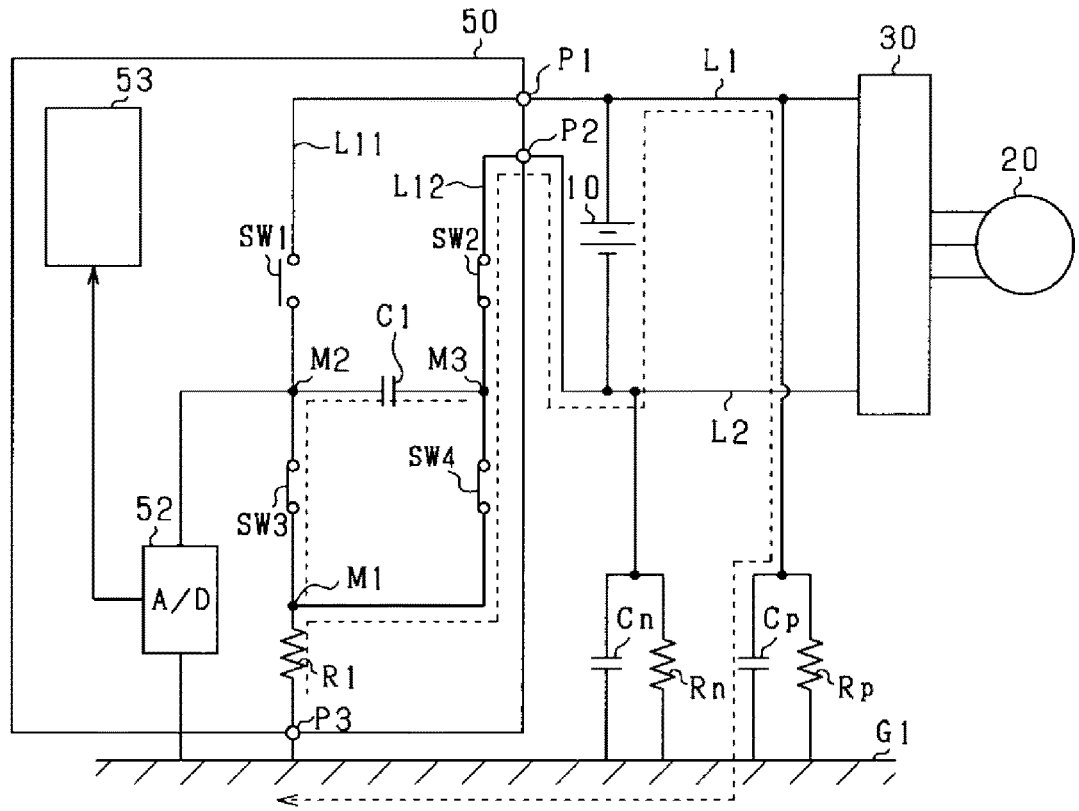
FIGS. 4A and 4B also are diagrams collectively illustrating an exemplary flow of electric current according to one embodiment of the present disclosure.

Subsequently, the controller 53 allows the capacitor C1 to discharge and the ground capacitance Cp to charge for a prescribed period (in step S105). Specifically, as shown in FIG. 4A, the controller 53 turns on the switches SW2, SW3 and SW4, and, on the other hand, turns off the switch SW1. With this, electric current flows from the assembled battery 10 into an electrical path formed by including the assembled battery 10, the ground capacitance Cp, the grounding section G1, the switch SW4, the switch SW2 and the assembled battery 10, thereby causing the ground capacitance Cp to charge. At the same time, current flows from the capacitor C1 into an electrical path formed by including the capacitor C1, the switch SW3, the switch SW4 and the capacitor C1, thereby causing the capacitor C1 to discharge.

Figure 4B:
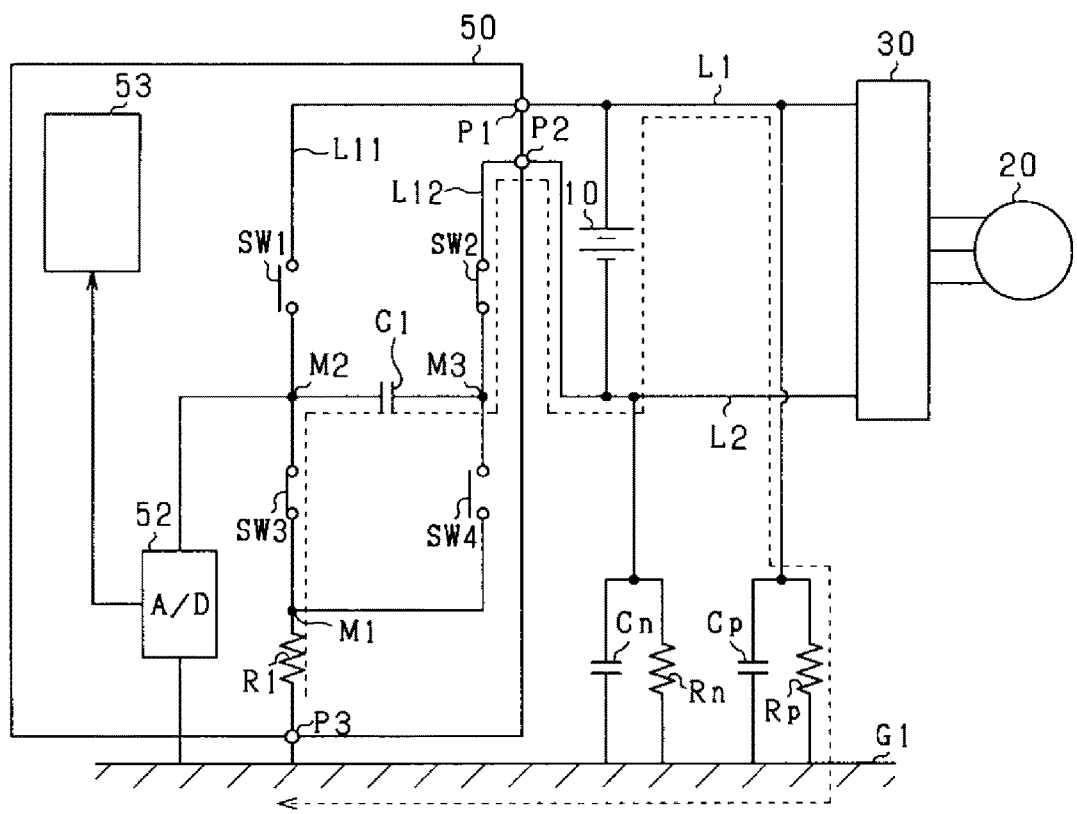

Subsequently, the controller 53 allows the capacitor C1 to charge via the ground fault resistance Rp for a prescribed period (in step S106). Specifically, as shown in FIG. 4B, the controller 53 turns on the switches SW2 and SW3, and turns off the switches SW1 and SW4, on the other hand. With this, current flows from the assembled battery 10 into an electrical path formed by including the assembled battery 10, the ground fault resistance Rp, the grounding section G1, the resistor R1, the switch SW3, the capacitor C1, the switch SW2 and the assembled battery 10, thereby causing the capacitor C1 to charge. Here, since the ground capacitance Cp has charged in step S106, the current is almost flown through the ground fault resistance Rp. Hence, in steps S105 and S106, the switch SW4 corresponds to the first switch, and the switch SW3 corresponds to the second switch.

Subsequently, the controller 53 reads the second voltage value Vp of the capacitor C1 (i.e., a charged voltage value) (in step S107). Specifically, the controller 53 turns on the switch SW4 on one hand, and turns off the switches SW1 to SW3 on the other hand, thereby inputting the voltage value of the capacitor C1 to the A/D convertor 52. The controller 53 reads a voltage value of the capacitor C1 converted by the A/D convertor 52 through the A/D convertor 52 as a second voltage value Vp. More specifically, the controller 53 detects a peak voltage value output from the capacitor C1 as the second voltage value Vp immediately after turning the switches SW1 to SW4.

Subsequently, similarly to the step S105, the controller 53 reads a battery voltage value Vb of the assembled battery 10 (in step S108). Here, the battery voltage value Vb detected in step S108 is herein below referred to as a second battery voltage value Vb2.

Subsequently, the controller 53 calculates ground fault resistances Rn and Rp based on the first voltage value Vn and the first battery voltage value Vb1 and the second voltage value Vp and the second battery voltage value Vb2 (in step S109). More specifically, the controller 53 calculates a composite value of the ground fault resistances Rn and Rp using below listed first to fourth equations, wherein T represents a period of time, C1 represents a capacitance of the capacitor C1, and R1 represents a resistance value of the resistor R1.

$$VP = Vb2 \times Q \times Rp/(Rp+Rn) \quad (1)$$

$$Vn = Vb1 \times Q \times Rn/(Rp+Rn) \quad (2)$$

$$Q = 1 - E^{\wedge}(-W) \quad (3)$$

$$W = (Rp+Rn)T/(Rp \times Rn + Rn \times R1 + R1 \times Rp)C1 \quad (4)$$

Subsequently, the controller 53 compares the composite value of the ground fault resistances Rn and Rp calculated in this way with a normal composite value of ground fault resistances Rn and Rp representing an insulated state to determine if an electrical leakage is either present or absent. The controller 53 performs various processes accordingly when it judges that the electrical leakage is present (i.e., when it judges that the insulated state is absent). For example, the controller 53 either outputs warning or isolates the assembled battery 10 from an electric circuit and the like. Specifically, the controller 53 controls the assembled battery 10 to stop supplying power therefrom and charging thereof.

Now, an exemplary detection method employed in this embodiment of the present disclosure is described in comparison with a conventional detection method. first, the conventional detection method is described. In the conventional detection method, none of ground capacitances Cn and Cp charge when the capacitor C1 discharges. Specifically, in steps S101 and S105 of FIG. 2, in which the ground fault resistance is calculated, the switches SW1 to SW3 are turned off, while the switch SW4 is turned on thereby causing the capacitor C1 to discharge.

Figure 5:
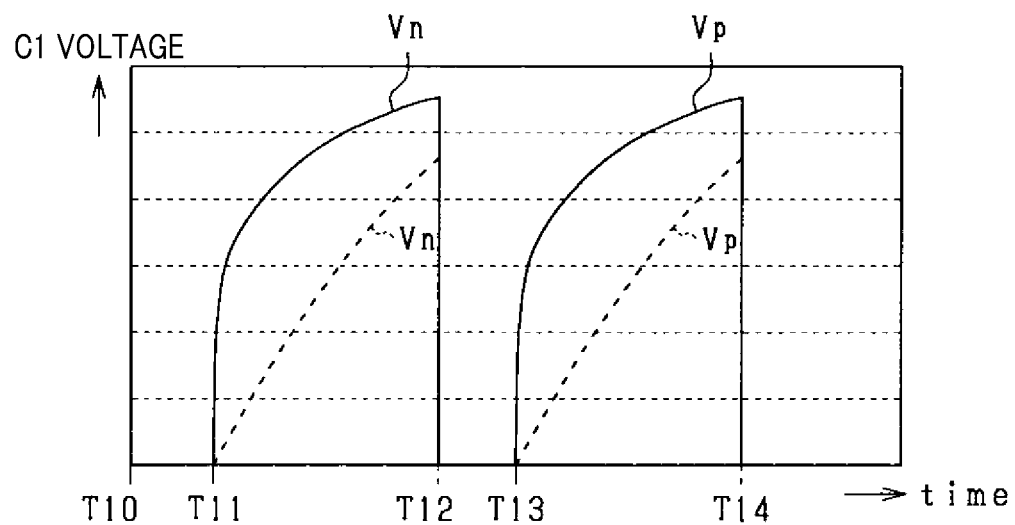
FIG. 5 is a time chart illustrating a temporal change in charged voltage in a conventional system.

Here, a temporal change in first voltage value Vn and a temporal change in second voltage value Vp obtained by the conventional detection method are illustrated in FIG. 5. Since the capacitor C1 discharges during a period from a time point T10 to a time point T11, a voltage of the capacitor C1 becomes zero. Subsequently, when the capacitor C1 charges through the ground fault resistance Rn during a period from a time point T11 to a time point T12, a charged voltage value of the capacitor C1 varies by receiving an influence of a ground fault resistance Rn and a ground capacitance Cn (i.e., an effect of a CR time constant). Here, a voltage value detected at any time during the period from the time point T11 to the time point T12 corresponds to the first voltage value Vn.

Subsequently, during a period from the time point T12 to a time point T13, since the capacitor C1 discharges, a voltage value of the capacitor C1 becomes zero. Subsequently, during a period of time from the time point T13 to a time point T14, when the capacitor C1 charges through the ground fault resistance Rp, a charged voltage value of the capacitor C1 varies by receiving an influence of the ground fault resistance Rp and the ground capacitance Cp (i.e., an effect of a CR time constant). Here, a voltage value detected at any time during the period from the time point T13 to the time point T14 corresponds to the second voltage value Vp. In FIG. 5, a solid line indicates a change in voltage when each of the ground fault capacitances Cn and Cp is relatively large. A broken line indicates a change in voltage when each of the ground fault capacitances Cn and Cp is relatively small.

Hence, as understood from FIG. 5, in the conventional detection method, in accordance with a value of each of the ground fault capacitances Cn and Cp, the temporal change in First voltage value Vn and that in second voltage value Vp vary. Specifically, as shown in FIG. 5, when the ground fault capacitance Cn is relatively large (as shown by the solid line), the temporal change in first voltage value Vn more increases than when the ground fault capacitance Cn is relatively small (as indicated by the broken line). Especially, since the first voltage value Vn logarithmically grows, the shorter the elapse of time after the start of charging, the greater the detection error.

Similarly, when the ground capacitance Cp is relatively large (as shown by the solid line), the temporal change in second voltage value Vp more increases than when the ground capacitance Cp is relatively smaller (as indicated by the broken line). Especially, since the second voltage value Vp logarithmically grows, the shorter the elapse of time after the start of charging, the greater the detection error.

Figure 6:
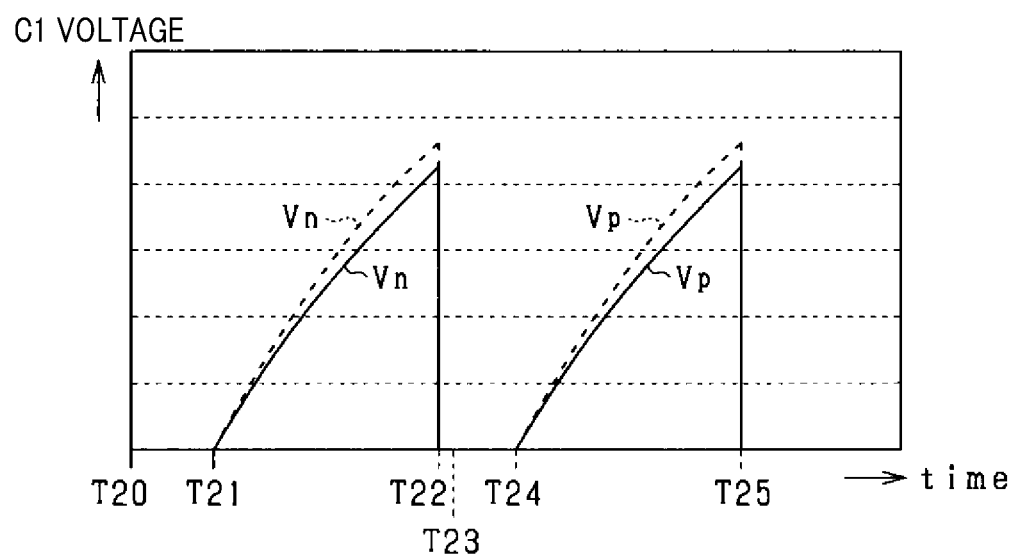
FIG. 6 is a time chart illustrating an exemplary temporal change in charged voltage according to one embodiment of the present disclosure.

Now, temporal changes in first voltage value Vn and second voltage value Vp obtained by the detection method of this embodiment of the present disclosure are described with ref to FIG. 6. At a time point T20, the capacitor C1 discharges and the ground capacitance Cn charges in step S101. Thus, during a period from the time point T20 to a time point T21, a voltage of the capacitor C1 becomes zero.

Subsequently, at the time point T21, the capacitor C1 charges through the ground fault resistance Rn in step S102. Hence, during the period from the time point T21 to the time point T22, a charged voltage of the capacitor C1 varies by receiving an influence of the ground fault resistance Rn. At this moment, however, since the ground capacitance Cn already has charged, the influence of the ground capacitance Cn can almost be neglected. Further, at the time point T22, a voltage value of the capacitor C1 is detected as the first voltage value Vn in step S103.

At a time point T23, the capacitor C1 discharges while the ground capacitance Cp charges in step S105. Because of this, during the period from the time point T23 to the time point T24, a voltage of the capacitor C1 becomes zero.

Subsequently, at the time point T24, the capacitor C1 charges through the ground fault resistance Rp in step S106. Hence, during the period from the time point T24 to a time point T25, a charged voltage value of the capacitor C1 varies by receiving influence of the ground fault resistance Rp. At this moment, however, since the ground capacitance Cp has already charged, influence of the ground capacitance Cp can almost be neglected. Further, at the time point T25, a voltage value of the capacitor C1 is detected as the second voltage value Vp in step S107.

As shown in FIG. 6, according to the detection method of this embodiment of the present disclosure, although values of the ground capacitances Cn and Cp are different from each other, temporal changes of the first and second voltage values Vp and Vn can almost be equalized. That is, as shown in FIG. 6, a temporal change in first voltage value Vn caused when the ground capacitance Cn is relatively large (as shown by a solid line) is similar to that caused when the ground capacitance Cn is relatively small (as indicated by a broken line). Hence, the temporal change in first voltage value Vn corresponds to a voltage value of the capacitor C1 during a period from the time point T21 to the time point T22.

Also, as shown in the drawing, a temporal change in second voltage value Vp caused when the ground capacitance Cp is relatively large (as shown by a solid line) is similar to that caused when the ground capacitance Cp is relatively small (as indicated by a broken line). Here, the temporal change of the second voltage value Vp corresponds to a voltage value of the capacitor C1 during a period from the time point T24 to the time point T25.

Hence, with the above-described configuration, favorable advantages can be obtained as described herein below.

According to the above-described configuration, when a given period of time has elapsed after a conduction state has been set between the cathode side power supply path L1 and the grounding section G1 by turning the switches SW1 and SW3 after the capacitor C1 discharges, the switch SW3 is brought to a non-conduction position thereby setting a non-conduction state between the cathode side power supply path L1 and the grounding section G1 and causing the capacitor C1 to charge. That is, the ground capacitance Cn existing between the cathode side power supply path L1 and the grounding section G1 is controlled to charge before the capacitor C1 charges. Hence, when the capacitor C1 is controlled to charge, decentralized power supply to the ground capacitance Cn can be suppressed. Therefore, as shown in FIG. 6, even if the ground capacitance Cn varies, detection error of the first voltage value Vn can be reduced. Further, as shown in FIG. 6, a detection error generated just after the capacitor C1 starts charging can be more reduced when compared with the conventional detection method. As a result, a period from when the capacitor C1 starts charging to when the first voltage value Vn is detected can be shortened.

Similarly, when a given period of time has elapsed after a conduction state has been set between the anode side power supply path L2 and the grounding section G1 by turning the switches SW2 and SW4 after the capacitor C1 discharges, the switch SW4 is brought to a non-conduction position thereby setting a non-conduction state between the anode side power supply path L2 and the grounding section G1 and causing the capacitor C1 to charge. That is, the ground capacitance Cp existing between the anode side power supply path L2 and the grounding section G1 is controlled to charge before the capacitor C1 charges. Hence, when the capacitor C1 is controlled to charge, decentralized power supply to the ground capacitance Cp can be suppressed. Therefore, as shown in FIG. 6, even if the ground capacitance Cp varies, a detection error of the second voltage value Vp can be reduced. Further, as shown in FIG. 6, a detection error generated just after the capacitor C1 starts charging can be more reduced when compared with the conventional detection method. As a result, a period from when the capacitor C1 starts charging to when the second voltage value Vp is detected can be shortened.

As described hereto fore, an error of calculation of each of the ground fault resistances Rn and Rp based on the first and second voltage values Vn and Vp can be either reduced or suppressed, and accordingly, accuracy of determination of electrical leakage based on the ground fault resistances Rn and Rp can be improved. Since an error generated shortly after the start of charging is suppressed when compared with the conventional detection method, a detection period for detecting each of the respective first and second voltage values Vn and Vp can also be reduced. That is, the period for detecting the electrical leakage can be shortened.

The controller 53 sets an energized state between the cathode side power supply path L1 (or the anode-side power supply path L2) and the grounding section G1 to cause the ground capacitances Cn and Cp to charge when the capacitor C1 discharges. More specifically, in step S101, the controller 53 turns on each of the switches SW1, SW3 and SW4 and, on the other hand, turns off the switch SW2 as shown in FIG. 3A. With this, the controller 53 forms the electrical path by including the assembled battery 10, the switch SW1, the switch SW3, the resistor R1, the grounding section G1, the ground capacitance Cn, and the assembled battery 10 to allow current to flow from the assembled battery 10 into the electrical path, thereby causing the ground capacitance Cn to charge. At the same time, the controller 53 also forms the electrical path by including the capacitor C1, the switch SW3, the switch SW4 and the capacitor C1 to allow current to flow from the capacitor C1 into the electrical path, thereby causing the capacitor C1 to discharge.

Also, as shown in FIG. 4A, in step S105, the controller 53 turns on the switches SW2, SW3 and SW4 and, on the other hand, turns off the switch SW1. With this, the controller 53 forms the electrical path by including the assembled battery 10, the ground capacitance Cp, the grounding section G1, the switch SW4, the switch SW2 and the assembled battery 10 to allow current to flow from the assembled battery 10 into the electrical path, thereby causing the ground capacitance Cp to charge. At the same time, the controller 53 forms the electrical path by including the capacitor C1, the switch SW3, the switch SW4 and the capacitor C1 to allow current to flow from the capacitor C1 into the electrical path, thereby causing the capacitor C1 to discharge.

Specifically, since the electrical path provided with the capacitor C1 and the electrical path provided with the ground capacitances Cn and Cp are parallel to each other, the controller 53 sets the energized state between the grounding section G1 and each of the power supply paths L1 and L2 when the capacitor C1 discharges. With this, since discharging of the capacitor C1 and charging of the ground capacitances Cn and Cp can be performed at the same time, a period for charging the ground capacitances Cn and Cp can be shortened as much as possible, thereby enabling to shorten a determination period.

Further, the switch SW3 is provided between the grounding section G1 and the capacitor C1. That is, one end of the switch SW3 is connected to a side of the grounding section G1, while the other end thereof is connected to a side of the connection point M2 connecting to the capacitor C1. Further, one end of the switch SW4 is connected to a side of the grounding section G1, while the other end thereof is connected to a side of the connection point M3 connecting to the capacitor C1. Hence, with the insulation resistance detection circuit 51 configured as described above, since the number of switching elements is decreased, a configuration of the circuit can be simplified. Specifically, the ground fault resistances Rn and Rp can be calculated by the four switches SW1 to SW4.

Further, with the insulation resistance detection circuit 51 having the configuration as described above, presence or absence of electrical leakage between the cathode side power supply path L1 and the grounding section G1 and that between the anode side power supply path L2 and the grounding section G1 can be determined by sharing a single capacitor C1. Hence, a configuration of the circuit can be simplified by decreasing the number of circuit elements.

When a battery voltage value of the assembled battery 10 varies, a charged voltage value generated by the capacitor C1 is negatively affected. In view of this, the controller 53 detects first and second battery voltage values Vb1 and Vb2 of the assembled battery 10 every time when it detects a charged voltage value of the capacitor C1. That is, the controller 53 determines if an electrical leakage is either present or absent in accordance with the first and second battery voltage value Vb1 and Vb2.

More specifically, the controller 53 detects the first battery voltage value Vb1 of the assembled battery 10 every time when it detects the first voltage value Vn. Similarly, the controller 53 detects the second battery voltage value Vb2 of the assembled battery 10 every time when it detects the second voltage value Vp. Subsequently, by using below described first to fourth equations, the controller 53 calculates ground fault resistances Rn and Rp based on the first and second battery voltage values Vb1 and Vb2 and the first and second voltage values Vn and Vp as well and determines if an electrical leakage is either present or absent. Hence, detection error caused by the variation of the battery voltage value is reduced, thereby enabling to improve accuracy of electrical leakage determination.

Now, an exemplary electrical leakage determination system 50 of a second embodiment of the present disclosure is described.

Even if the electrical leakage determination system 50 of the first embodiment of the present disclosure is utilized, temporal changes in respective voltage values Vn and Vp are slightly different from each other depending on values of the ground capacitances Cn and Cp (i.e., a large size and a small size) as shown in FIG. 6. To explain this in more detail, when the ground capacitances Cn and Cp are relatively small, detected voltage values Vn and Vp tend to increase more than when the ground capacitances Cn and Cp are relatively large. That is, such a tendency can be caused by the resistor R1. That is, since current flows into it through the resistor R1 when the ground capacitances Cn and Cp charge, it is supposed that the ground capacitances Cn and Cp cannot appropriately charge when a size of the resistor R1 is too large.

Figure 7:
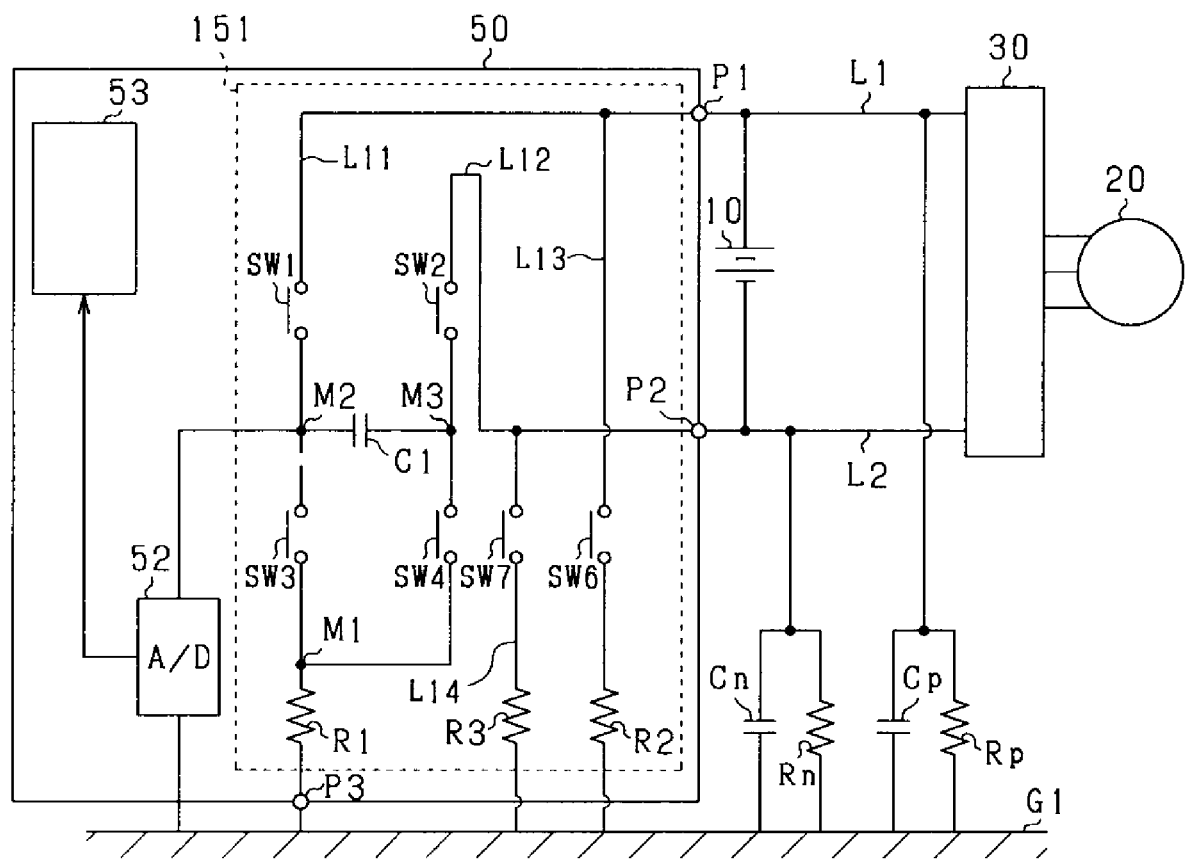
FIG. 7 is a diagram illustrating an exemplary electric circuit of an electrical leakage determination system according to a second embodiment of the present disclosure.

Then, according to the second embodiment of the present disclosure, a configuration of an insulation resistance detection circuit 151 is modified based on the insulation resistance detection circuit 51 of the first embodiment of the present disclosure as described below. Specifically, as shown in FIG. 7, to a wiring portion between the external terminal P1 and the switch SW1, one end of a switch SW6 is connected. The other end of the switch SW6 is connected in series to one end of a resistor R2. Further, the other end of the resistor R2 is connected to a grounding section G1. Specifically, a third electrical path L13 is established parallel to a capacitor C1 (i.e., an electrical path including the capacitor C1), and the switches SW6 and the resistor R2 are disposed therein. The switch SW6 is connected in series to the resistor R2 and is connected to the grounding section G1 via the resistor R2. A size of the resistor R2 is smaller than that of the resistor R1.

Further, to a wiring portion between the external terminal P2 and the switch SW2, one end of a switch SW7 is connected. The other end of the switch SW7 is connected in series to one end of the resistor R3. Further, the other end of the resistor R3 is connected to the grounding section G1. Specifically, a fourth electrical path L14 is established parallel to the capacitor C1 (i.e., an electrical path including the capacitor C1), the switches SW7 and the resistor R3 are provided therein. The switch SW7 is connected in series to the resistor R3 and is connected to the grounding section G1 via the resistor R3. A size of the resistor R3 is smaller than that of the resistor R1. In this embodiment of the present disclosure, the resistors R2 and R3 collectively correspond to the first resistors and the resistor R1 corresponds to the second resistor.

Figure 8:
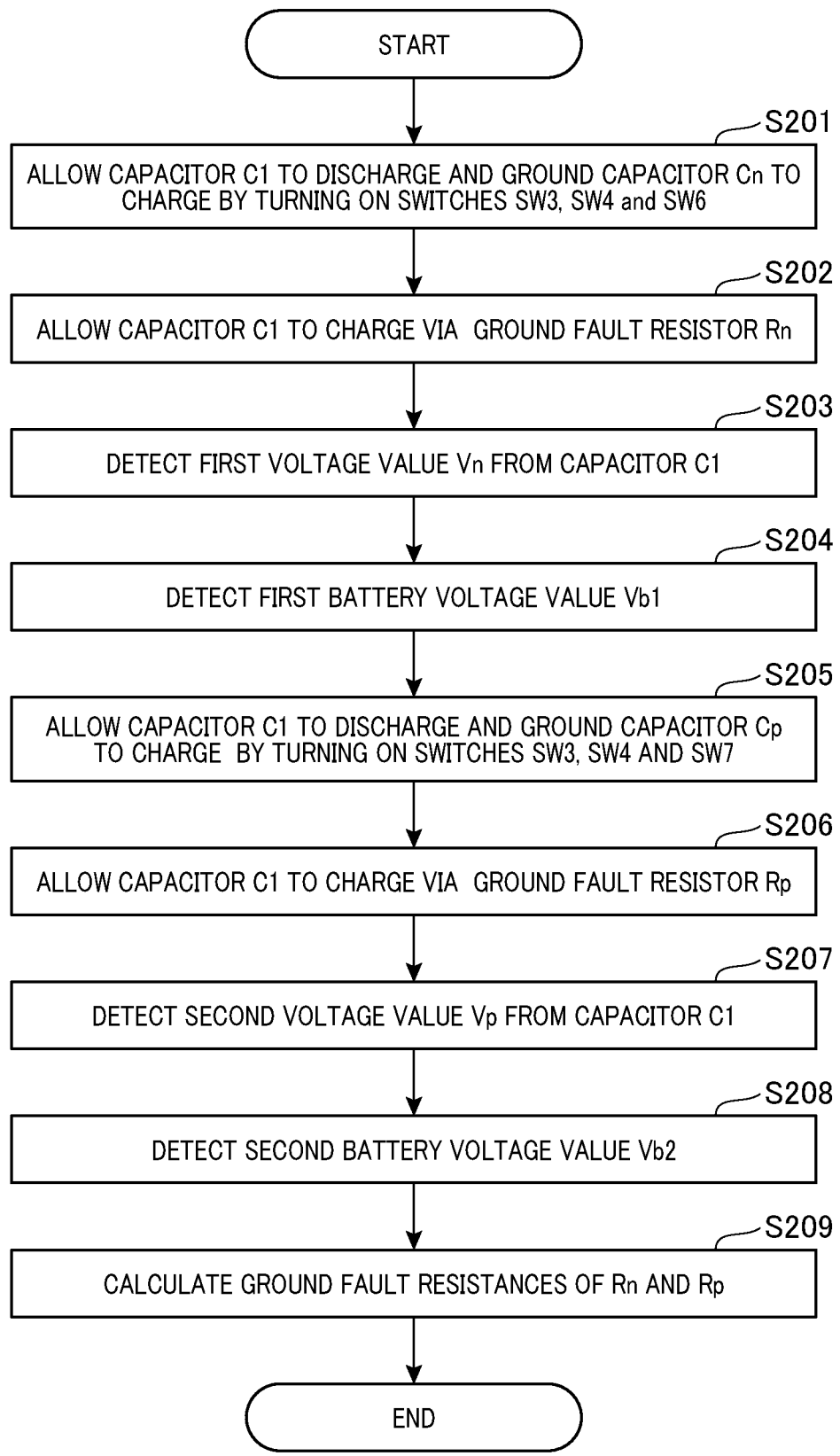
FIG. 8 is a flowchart illustrating an exemplary ground fault resistance calculation process according to the second embodiment of the present disclosure.

Now, an exemplary ground fault resistance calculation process executed in the second embodiment of the present disclosure is described with reference to FIG. 8. As shown in FIG. 8, the controller 53 initially allows the capacitor C1 to discharge while controlling the ground capacitance Cn to charge for a given period (in step S201). Specifically, the controller 53 turns on switches SW3, SW4 and SW6 while turning off the switches SW1, SW2 and SW7. Hence, electric current flows from the assembled battery 10 into an electrical path formed by including the assembled battery 10, the switch SW6, the resistor R2, the grounding section G1, the ground capacitance Cn and the assembled battery 10, thereby causing the ground capacitance Cn to charge. At the same time, current flows from the capacitor C1 into an electrical path formed by including the capacitor C1, the switch SW3, the switch SW4 and the capacitor C1, thereby causing the capacitor C1 to discharge.

Subsequently, the controller 53 turns off the switches SW6 and SW7 and detects a first voltage value Vn and a first battery voltage value Vb1 in steps S202 to S204. Here, processes performed in steps S202 to S204 are equivalent to those in steps S102 to S104, respectively, and are not repeatedly described. Further, as described in steps S201 and S202, the switch SW6 corresponds to the first switch, and the switch SW4 corresponds to the second switch.

Subsequently, the controller 53 allows the capacitor C1 to discharge while controlling the ground capacitance Cp to charge for a given period (in step S205). Specifically, the controller 53 turns on the switches SW3, SW4 and SW7 while turning off the switches SW1, SW2 and SW6. Hence, electric current flows from the assembled battery 10 into an electrical path formed by including the assembled battery 10, the ground capacitance Cp, the grounding section G1, the resistor R3, the switch SW7 and the assembled battery 10, thereby causing the ground capacitance Cp to charge. At the same time, current flows from the capacitor C1 into an electrical path formed by including the capacitor C1, the switch SW3, the switch SW4 and the capacitor C1, thereby causing the capacitor C1 to discharge.

Subsequently, the controller 53 turns off the switches SW6 and SW7 and detects a second voltage value Vp and a second battery voltage value Vb2 in steps S206 to S208. Here, processes executed in steps S206 to S208 are equivalent to those of steps S106 to S108, respectively. Further, as executed in steps S205 and S206, the switch SW7 corresponds to the first switch and the switch SW3 corresponds to the second switch.

Subsequently, similar to the step S109, the controller 53 calculates ground fault resistances Rn and Rp based on a first voltage value Vn and a first battery voltage value Vb1, and a second voltage value Vp and a second battery voltage value Vb2, respectively (in step S209). Subsequently, by comparing a synthetic value of the ground fault resistances Rn and Rp calculated in this way with that of normal ground fault resistances (indicating an insulation state) Rn and Rp, the controller 53 determines if an electrical leakage is either present or absent.

Hence, with the above-described configuration, below described advantages can be obtained.

That is, when a value of the resistor R1 located in the electrical path is too large, the ground capacitances Cn and Cp do not sufficiently charge thereby being likely to cause the detection error sometimes. That is, when the resistor R1 that limits an amount of current to cause the capacitor C1 to charge is used to cause the ground capacitances Cn and Cp to charge, the ground capacitances Cn and Cp sometimes cannot appropriately charge. In view of this, the multiple resistors R2 and R3 having different values from that of the resistor R1 are connected in series to the respective switches SW6 and SW7 and current flows through these resistors R2 and R3 to cause the ground capacitances Cn and Cp to charge. With this, the ground capacitances Cn and Cp can appropriately charge, thereby enabling suppression of the detection error.

Now, yet another exemplary electrical leakage determination system 50 of a third embodiment of the present disclosure is herein below described.

Figure 9:
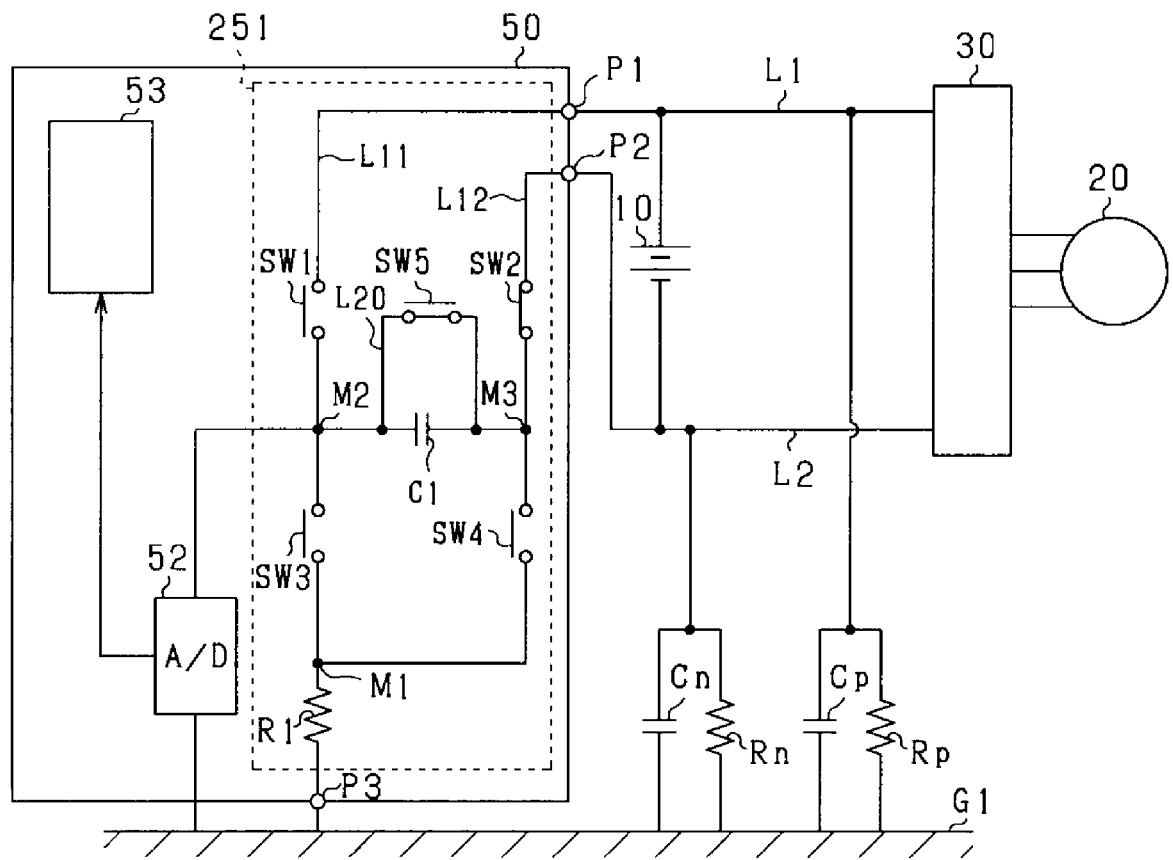
FIG. 9 is a diagram illustrating an exemplary electric circuit of an electrical leakage determination system according to a third embodiment of the present disclosure.

Specifically, in FIG. 9, an insulation resistance detection circuit 251 employed in the third embodiment of the present disclosure is illustrated. In the insulation resistance detection circuit 251, a bypass path L20 is provided parallel to the capacitor C1 between the connection points M2 and M3 to bypass the capacitor C1. Further, a switch SW5 is provided as a first switch in the bypass path L20. Hence, when the ground capacitances Cn and Cp charge, the switch SW5 is turned on (i.e., an energizing position) to inhibit the capacitor C1 from charging.

Figure 10:
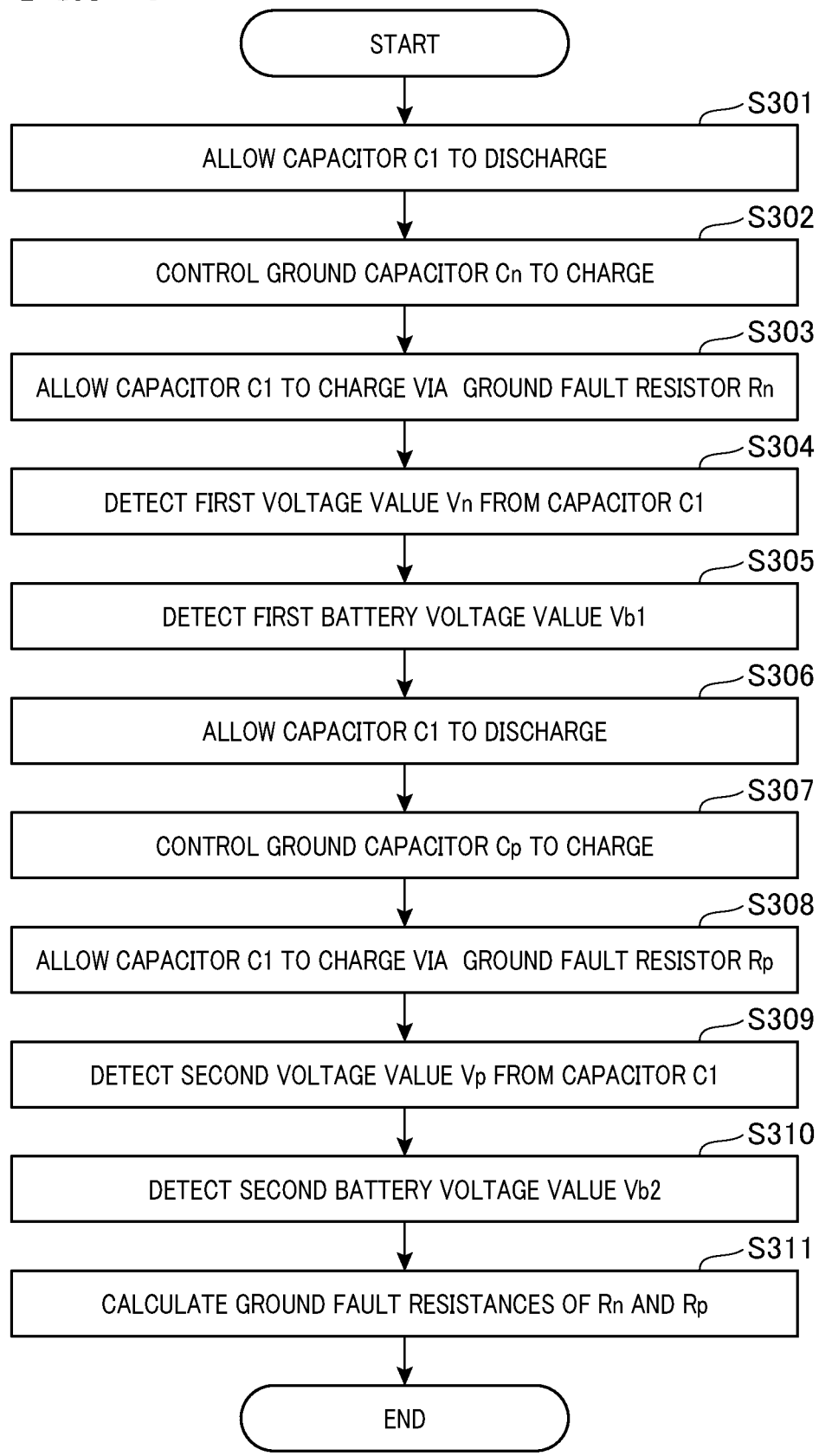
FIG. 10 is a flowchart illustrating an exemplary ground fault resistance calculation process according to the third embodiment of the present disclosure.

Herein below, an exemplary ground fault resistance calculation processing performed in the third embodiment of the present disclosure is described with reference to FIG. 10. First, the controller 53 allows the capacitor C1 to discharge (in step S301). Specifically, to cause the capacitor C1 to discharge, the controller 53 turns on the switches SW3 and SW4, while turning off the switches SW1, SW2 and SW5.

Subsequently, after the discharge of the capacitor C1, the controller 53 controls the ground capacitance Cn to charge (in step S302). Specifically, the controller 53 turns on the switches SW1, SW4 and SW5 while turning off the switches SW2 and SW3. Hence, electric current flows from the assembled battery 10 into an electrical path formed by including the assembled battery 10, the switch SW1, the switch SW5, the switch SW4, the resistor R1, the grounding section G1, the ground capacitance Cn, and the assembled battery 10, thereby causing the ground capacitance Cn to charge.

Subsequently, the controller 53 turns off the switch SW5 and performs given processes in steps S303 to S305, respectively. Here, since the processes performed in steps S303 to S305 are equivalent to those performed in steps S102 to S104, respectively, descriptions are not repeated.

Subsequently, similar to the process performed in step S301, the controller 53 allows the capacitor C1 to discharge (in step S306). After the discharge of the capacitor C1, the controller 53 controls the ground capacitance Cp to charge (in step S307). Specifically, the controller 53 turns on the switches SW2, SW3 and SW5, and, on the other hand, turns off the switches SW1 and SW4. Hence, electric current flows from the assembled battery 10 into an electrical path formed by including the assembled battery 10, the ground capacitance Cp, the grounding section G1, the switch SW3, the switch SW5, the switch SW2 and the assembled battery 10, thereby causing the ground capacitance Cp to charge. Subsequently, the controller 53 performs given processes in steps S308 to S311, respectively. Here, since processes performed in steps S308 to S311 are equivalent to those performed in steps S106 to S109, respectively, descriptions are not repeated. Subsequently, by comparing a synthetic value of the ground fault resistances Rn and Rp calculated in this way with that of normal ground fault resistances Rn and Rp (indicating an insulation state), the controller 53 determines if an electrical leakage is either present or absent.

Further, in the third embodiment of the present disclosure, a resistor connected in series to the switch SW5 may be employed in the bypass path L20 to limit current. In such a situation, the ground capacitances Cn and Cp can appropriately charge by appropriately adjusting an amount of current flown thereto.

Further, the present invention is not limited to the above-described embodiments and includes various modifications as far as it falls within substantially the same concept as the present invention.

For example, although the composite value of the ground fault resistances Rn and Rp is calculated and either presence or absence of electrical leakage is determined based on the composite value in the above-described embodiment of the present disclosure, the present invention is not limited thereto, and each of the ground fault resistances Rn and Rp may be separately calculated to be used. That is, either presence or absence of electrical leakage between the cathode side power supply path L1 and the grounding section G1 and that between the anode side power supply path L2 and the grounding section G1 can be separately determined based on the ground fault resistances Rp and Rn, respectively.

Further, as a modification of the above-described embodiments of the present disclosure, either presence or absence of electrical leakage between the cathode side power supply path L1 and the grounding section G1 or that between the anode side power supply path L2 and the grounding section G1 can be only selectively determined.

Further, as yet another modification of the above-described embodiments of the present disclosure, a capacitor to charge to determine if an electrical leakage is either present or absent between the cathode side power supply path L1 and the grounding section G1 and a capacitor to charge to determine if an electrical leakage is either present or absent between the anode side power supply path L2 and the grounding section G1 can be separately employed.

Further, in the above-described second embodiment of the present disclosure, values of the resistors R2 and R3 can be different from each other.

Further, although the capacitor C1 and the ground capacitances Cn and Cp charge at the same time in the second embodiment of the present disclosure, these devices can be charged at different times from each other as well.

Although whenever the first and second voltage values Vn and VP are detected, the battery voltage values Vb1 and Vb2 are detected in the above-described embodiments of the present disclosure, respectively, only the battery voltage value Vb can be calculated every when the ground fault resistances Rn and Rp are calculated. Further, the battery voltage value Vb can be calculated only once when the ground fault resistance calculation process is started, for example.

Numerous additional modifications and variations of the present disclosure are possible in light of the above teachings. It is therefore to be understood that within the scope of the appended claims, the present disclosure may be performed otherwise than as specifically described herein. For example, the electrical leakage determination system is not limited to the above-described various embodiments and may be altered as appropriate.

What is claimed is:
1. An electrical leakage determination system to determine if an electrical leakage occurs between a power supply path connected to a power supply terminal of a DC power supply and a grounding section, the electrical leakage determination system comprising:
    a detection circuit connected to the power supply path and the grounding section, the detection circuit including:
        a capacitor having first and second ends, the first end connected to the power supply path, the second end connected to the grounding section; and
        at least one switch disposed in an electrical path formed parallel to the capacitor to switch a state of the detection circuit between the power supply path and the grounding section between a conduction state and a non-conduction state when brought to first and second positions opposite to each other, respectively, the at least one switch changing a current flow route in the detection circuit to cause the capacitor to discharge and to allow a ground capacitance present between the power supply path and the grounding section to charge when brought to one of the first and second positions, the at least one switch changing the current flow route in the detection circuit to allow the capacitor to charge by receiving current flowing through a ground fault resistance and the DC power supply while bypassing the ground capacitance when brought to the other one of the first and second positions, the ground fault resistance being present between the power supply path and the grounding section;

a capacitor voltage detector to detect a voltage value of the capacitor; and a controller to control the at least one switch, wherein the controller initially brings the at least one switch to the first position, and to the second position when a given period has elapsed after the controller initially brings the at least one switch to the first position, wherein the controller subsequently determines if the electrical leakage occurs at least based on the voltage value detected by the capacitor voltage detector.

2. The electrical leakage determination system as claimed in claim 1, wherein the at least one switch includes at least one first switch and at least one second switch, wherein one end of the at least one first switch is connected to the grounding section and the other end of the at least one first switch is connected to the first end of the capacitor, wherein the at least one second switch is disposed between the grounding section and the capacitor, the at least one second switch having two ends, one end of the at least one second switch connected to the grounding section, the other end of the at least one second switch connected to the second end of the capacitor, wherein the controller brings the at least one first and second switches to one of the first and second positions, respectively, to allow the capacitor to discharge, wherein when the given period has elapsed after the controller brings the at least one first and second switches to the one of the first and second positions, respectively, the controller switches a position of the at least one first switch to the other one of the first and second positions while maintaining the at least one second switch at the one of the first and second positions to allow the capacitor to charge, wherein the controller subsequently obtains the voltage value of the capacitor detected by the capacitor voltage detector and determines if the electrical leakage occurs based on the voltage value.

3. An electrical leakage determination system connected to both of a cathode side power supply path connected to a cathode side terminal of a DC power supply and an anode-side power supply path connected to an anode side terminal of the DC power supply to determine if an electrical leakage occurs between the cathode-side power supply path and a grounding section and between the anode side power supply path and the grounding section, the electrical leakage determination system comprising:

a detection circuit connected to the cathode side power supply path, the anode side power supply path and the grounding section, the detection circuit including:

a cathode-side switch to switch a state of a circuit between the cathode-side power supply path and a capacitor between a conduction state and a non-conduction state when brought to first and second positions opposite to each other, respectively, the cathode-side switch having first and second ends, the first end connected to the cathode-side power supply path, the second end connected to a first end of the capacitor;

an anode-side switch to switch a state of a circuit between the anode-side power supply path and the capacitor between a conduction state and a non-conduction state when brought to first and second positions opposite to each other, respectively, the anode-side switch having first and second ends, the first end connected to the anode-side power supply path, the second end connected to a second end of the capacitor;

a first grounding section side switch to switch a state of a circuit between the grounding section and the capacitor between a conduction state and a non-conduction state when brought to first and second positions opposite to each other, respectively, the first grounding section side switch having first and second ends, the first end connected to the grounding section, the second end connected to the first end of the capacitor;

a second grounding section side switch to switch a state of a circuit between the grounding section and the capacitor between a conduction state and a non-conduction state when brought to first and second positions opposite to each other, respectively, the second grounding section side switch having first and second ends, the first end connected to the grounding section, the second end connected to the second end of the capacitor;

a capacitor voltage detector to detect a voltage value of the capacitor; and a controller to control each of the cathode-side switch, the anode-side switch, the first grounding section side switch and the second grounding section side switch, wherein the controller obtains a first voltage value of the capacitor detected by the capacitor voltage detector when each of the cathode-side switch, the first grounding section side switch, and the second grounding section side switch is brought to one of the first and second positions, and the anode-side switch is brought to the other one of the first and second positions as a first switching combination to cause the capacitor to discharge and allow a ground capacitance present between the cathode side power supply path and the grounding section to charge, and then a predetermined period has elapsed after the controller has established the first switching combination, and the controller brings the first grounding section side switch to the other one of the first and second positions to allow the capacitor to charge by receiving current flowing through a ground fault resistance present between the cathode side power supply path and the grounding section and the DC power supply while maintaining positions of the switches other than the first grounding section side switch, wherein the controller obtains a second voltage value of the capacitor detected by the capacitor voltage detector when the cathode-side switch is brought to the other one of the first and second positions, and each of the anode-side switch, the first grounding section side switch, and the second grounding section side switch is brought to the one of the first and second positions as a second switching combination to cause the capacitor to discharge and allow a ground capacitance present between the anode side power supply path and the grounding section to charge, and then a predetermined period has elapsed after the controller has established the second switching combination, and the controller brings the first grounding section side switch to the other one of the first and second positions while maintaining positions of the switches other than the first grounding section side switch to allow the capacitor to charge by receiving current flowing through a ground fault resistance present between the anode side power supply path and the grounding section, wherein the controller determines if the electrical leakage occurs based on the first and second voltage values.

4. The electrical leakage determination system as claimed in claim 1, further comprising a power supply voltage detector to detect a voltage value of the DC power supply, wherein the controller detects the voltage value of the DC power supply every time the capacitor charges and determines if the electrical leakage occurs based on the voltage value of the capacitor in accordance with the voltage value of the DC power supply.

* * * * *